United States Patent
Sun et al.

(10) Patent No.: US 11,961,934 B2
(45) Date of Patent: Apr. 16, 2024

(54) VISIBLE LIGHT DETECTOR WITH HIGH-PHOTORESPONSE BASED ON $TiO_2/MoS_2$ HETEROJUNCTION AND PREPARATION THEREOF

(71) Applicant: UNIVERSITY OF SCIENCE AND TECHNOLOGY BEIJING, Beijing (CN)

(72) Inventors: Yinghui Sun, Beijing (CN); Bingxu Liu, Beijing (CN); Rongming Wang, Beijing (CN)

(73) Assignee: UNIVERSITY OF SCIENCE AND TECHNOLOGY BEIJING, Beijing (CN)

( * ) Notice: Subject to any disclaimer, the term of this patent is extended or adjusted under 35 U.S.C. 154(b) by 243 days.

(21) Appl. No.: 17/343,048

(22) Filed: Jun. 9, 2021

(65) Prior Publication Data
US 2022/0005967 A1    Jan. 6, 2022

(30) Foreign Application Priority Data

Jul. 3, 2020 (CN) .......................... 202010631397.X

(51) Int. Cl.
*H01L 31/109* (2006.01)
*H01L 31/0336* (2006.01)
*H01L 31/18* (2006.01)

(52) U.S. Cl.
CPC ...... *H01L 31/109* (2013.01); *H01L 31/03365* (2013.01); *H01L 31/1828* (2013.01)

(58) Field of Classification Search
None
See application file for complete search history.

(56) References Cited

U.S. PATENT DOCUMENTS

| | | | |
|---|---|---|---|
| 2015/0034907 A1* | 2/2015 | Hersam | H01L 29/24 257/26 |
| 2016/0020352 A1* | 1/2016 | Konstantatos | H01L 31/035218 438/94 |
| 2019/0363215 A1* | 11/2019 | Adinolfi | H01L 31/02019 |
| 2021/0098611 A1* | 4/2021 | Hersam | G11C 13/0007 |
| 2021/0175419 A1* | 6/2021 | Sangwan | H10N 70/24 |

FOREIGN PATENT DOCUMENTS

| | | | | |
|---|---|---|---|---|
| EP | 2975652 B1 * | 7/2019 | | H01L 31/035218 |
| WO | WO-2014178016 A2 * | 11/2014 | | H01L 31/028 |

* cited by examiner

*Primary Examiner* — Suberr L Chi
(74) *Attorney, Agent, or Firm* — Brooks Kushman P.C.

(57) ABSTRACT

In the field of photoelectric devices, a visible light detector is provided with high-photoresponse based on a $TiO_2/MoS_2$ heterojunction and a preparation method thereof. The detector, based on a back-gated field-effect transistor based on $MoS_2$, includes a $MoS_2$ channel, a $TiO_2$ modification layer, a $SiO_2$ dielectric layer, Au source/drain electrodes and a Si gate electrode, The $TiO_2$ modification layer is modified on the surface of the $MoS_2$ channel. By employing micromechanical exfoliation and site-specific transfer of electrodes, the method is intended to prepare a detector by constructing a back-gated few-layer field-effect transistor based on $MoS_2$, depositing Ti on the channel surface, and natural oxidation.

5 Claims, 18 Drawing Sheets

VISIBLE LIGHT DETECTOR WITH HIGH-PHOTORESPONSE BASED ON TiO$_2$/MoS$_2$ HETEROJUNCTION AND PREPARATION THEREOF

CROSS REFERENCE TO RELATED APPLICATION

This application claims foreign priority benefits under 35 U.S.C. § 119(a)-(d) to CN Application 202010631397.X filed Jul. 3, 2020, which is hereby incorporated by reference in its entirety.

TECHNICAL FIELD

The present disclosure relates to the field of photoelectric devices, and specifically relates to a visible light detector with high-photoresponse based on TiO$_2$/MoS$_2$ heterojunction and a preparation method thereof.

BACKGROUND

With the development of photoelectric devices towards highly horizontal integration and continuous longitudinal thinning, the commercial application of silicon-based field-effect transistors is facing the bottleneck of further miniaturization. The emergence of two-dimensional transition metal dichalcogenides (TMDCs) inspires new hope for the continuation of Moore's Law. TMDCs have shown very important application prospects in microelectronic and optoelectronic fields including field-effect transistors, light emitting diodes, photodetectors, and the like because of their excellent physical characteristics such as tunable energy band structure, strong excitonic emission, high on/off ratio of current, etc. However, the low photo-responsivity and low specific detectivity of the photodetector based on a single-component of TMDCs are difficult to meet the needs in practical applications. Therefore, it is an important research field at present to design and fabricate high-performance photodetectors based on TMDCs heterostructures at nanoscale. In particular, there are still many opportunities for the development of metal oxides/TMDs photodetectors with high photoresponse.

In the heterostructures of metal oxides/TMDCs, different interface charge effects, including charge transfer, charge traps, dielectric screening, piezoelectric effects and the like, can be used to optimize the photoelectric properties and promote their application potentials in the optoelectronic field. The interface charge effects between metal oxides and TMDCs are closely related to the interface states. Metal oxides/TMDCs heterojunction has controllable surfaces and interfaces, as well as unique energy band alignment, so it is expected to become one of the most promising photoelectric functional materials. The significantly enhanced photoresponse performance of the photodetector based on metal oxides/TMDCs heterojunction not only provides a good foundation for its application in photoelectric detectors, but also inspires a new idea for constructing novel high performance photodetectors based on TMDCs.

SUMMARY

To overcome the deficiencies of the prior art, the present disclosure is intended to provide a visible light detector with high-photoresponse based on TiO$_2$/MoS$_2$ heterojunction and a preparation method thereof.

The present disclosure employs the following technical schemes:

A visible light detector with high-photoresponse based on TiO$_2$/MoS$_2$ heterojunction, the detector is based on a back-gated field-effect transistor based on MoS$_2$, the detector includes a MoS$_2$ channel, a TiO$_2$ modification layer, a SiO$_2$ dielectric layer, Au source/drain electrodes and a Si gate electrode, the TiO$_2$ modification layer is modified on the surface of the MoS$_2$ channel. In the present disclosure, we employ a micromechanical exfoliation method to prepare MoS$_2$ flakes. Through this method, layer-structured bulks are exfoliated by using adhesive tapes, which would not destroy the covalent bonds in the plane of MoS$_2$, and the resulting MoS$_2$ generally has the characteristics of few defects, high crystallinity and clean surface. However, the preparation of MoS$_2$ flakes is not restricted to the micromechanical exfoliation method. Single-layer or few-layer MoS$_2$ prepared by a chemical vapor deposition method can also be used instead. To obtain smooth and uniform metal oxide nanostructures, a certain thickness of Ti is deposited on the surface of MoS$_2$ by using e-beam evaporation, and then oxidized naturally to get TiO$_2$. Because the e-beam evaporation has the advantages of high energy density and controllable depositing rate compared with other physical vapor deposition methods, so it can be used to prepare thin-film materials with high purity and high uniformity.

Furthermore, the MoS$_2$ channel is few-layer MoS$_2$ flakes with a high crystallinity.

Furthermore, the MoS$_2$ flakes are in a hexagonal phase with a single-crystal structure, showing semiconducting properties;

Furthermore, the few-layer means 3 layers, and the overall thickness is 2-2.5 nm.

Furthermore, the lateral dimension of the MoS$_2$ flakes is at least 10 μm.

Furthermore, the TiO$_2$ modification layer is a naturally oxidized TiO$_2$ layer.

Furthermore, the thickness of the TiO$_2$ layer is 1-2 nm.

Furthermore, the TiO$_2$ layer is in a crystalline state or an amorphous state, and when the TiO$_2$ layer is in the crystalline state, it has single-crystal sheets, and the sheet dimension is 2-3 nm.

Furthermore, at a zero-gate voltage and under the illumination of a white-light LED, the detector can reach a high photoresponsivity of 1099 A/W and a high specific detectivity of $1.67 \times 10^{13}$ Jones.

The present disclosure also provides a method of preparing the visible light detector with high-photoresponse based on TiO$_2$/MoS$_2$ heterojunction, including the following steps:

S1. preparing MoS$_2$ flakes, and transferring the MoS$_2$ flakes onto a SiO$_2$/Si wafer;

S2. construction of a transistor based on MoS$_2$: site-specific transferring gold electrodes onto the MoS$_2$ flakes obtained in step S1, getting source/drain electrodes of the detector; the highly-doped Si substrate is a gate electrode;

S3. e-beam evaporation of Ti: depositing a certain thickness of metallic Ti film on the channel surface of the transistor based on MoS$_2$ constructed in step S2, getting a device based on Ti/MoS$_2$ heterojunction;

S4. natural oxidation: exposing the device based on Ti/MoS$_2$ heterojunction prepared in step S3 in air for oxidation, obtaining a TiO$_2$/MoS$_2$ heterojunction for a visible-light detector.

Furthermore, in step S1, the MoS$_2$ flakes are prepared by a micromechanical exfoliation method, and the MoS$_2$ flakes are heated after being transferred onto the SiO$_2$/Si wafer.

Furthermore, the micromechanical exfoliation method is to tear and stick bulk $MoS_2$ crystals repeatedly by using adhesive tapes, getting adhesive tapes attached with $MoS_2$ thin layers, which are transferred onto the $SiO_2/Si$ wafer.

Furthermore, the $SiO_2/Si$ wafer attached with $MoS_2$ on adhesive tapes is heated on a heating plate at 100° C. for 2 min.

Furthermore, in step S2, the electrode thickness of the transistor based on $MoS_2$ is 50 nm, and after the transistor based on $MoS_2$ is constructed, it is annealed at 200° C. in an atmosphere of $Ar/H_2$ at 10 Pa for 1 h.

Furthermore, in step S3, the thickness of the e-beam-evaporated Ti film is 2 nm, and the depositing rate is 0.2 Å/s.

The present disclosure provides a controllable method of constructing a photodetector with high-photoresponse based on $TiO_2/MoS_2$ heterojunction, in which a micromechanical exfoliation method is firstly employed to get $MoS_2$ flakes, then a back-gated field-effect transistor based on $MoS_2$ is constructed by a process of transferring the electrodes, followed by depositing metal Ti on the channel surface, and finally natural oxidation to get the photodetector based on $TiO_2/MoS_2$.

The photodetector based on $TiO_2/MoS_2$ prepared in the present disclosure has both high photoresponsivity and high specific detectivity, significantly improving the $MoS_2$ visible light detection performance, and effectively promoting the further development of photodetectors based on transition metal dichalcogenides.

The present disclosure has the following innovations and beneficial effects:

1. Compared with the photodetector based on 73-layer $MoS_2$ prepared by a pulse laser deposition method, the few-layer $MoS_2$ exfoliated mechanically in the photodetector based on $TiO_2/MoS_2$ has an innovation in the channel thickness, in which the channel thickness of the transistor is reduced by 96%.

2. Compared with the traditional way of evaporating electrodes, the construction of a transistor by site-specific transferring electrodes can obtain a relatively perfect contact interface, so that the device can display good Ohmic output characteristics, which is conducive to the transport of photo-generated carriers between the electrodes and $MoS_2$.

3. The acquisition of $TiO_2$ modification layer by the natural oxidation of Ti is a major innovation of the present disclosure. This method can avoid the damage to the $MoS_2$ lattice or the introduction of chemical impurities, compared with the direct evaporation of $TiO_2$ or spin coating of $TiO_2$ synthesized by chemical methods; moreover, due to the strong wettability of Ti on the surface of $MoS_2$, ultrathin and layered $TiO_2$ can be obtained, thus increasing the contact area between $TiO_2$ and $MoS_2$. In addition, the incomplete oxidation of Ti allows more oxygen vacancies to be generated in $TiO_2$, thus producing significant responses to visible light.

4. The study on the photo-responsive behavior of the photodetector based on $TiO_2/MoS_2$ to white light is also a major innovation of the present disclosure. The traditional photodetector based on $MoS_2$ generally explores the photo-response to the light with a single wavelength, while the present study provides a foundation for the application of the photodetector based on $MoS_2$ in the field of visible light detection.

5. The materials used in the preparation method are cost-effective, the operation procedure is simple and controllable, the products have uniform morphology and sizes, thus overcoming the disadvantages of complex processing procedure, tedious steps, and harsh conditions required in the existing technologies, thereby greatly reducing the cost compared with the physical vapor deposition of $TiO_2$ and the electrodes made by e-beam lithography.

BRIEF DESCRIPTION OF THE DRAWINGS

FIG. 3B shows a fast Fourier transform pattern of the high-resolution transmission electron microscope image containing the region as shown in FIG. 3a.

DETAILED DESCRIPTION

Specific examples of the present disclosure will be described in detail in combination with the attaching drawings below. It should be noted that the technical features or the combination thereof described in the following examples should not be considered to be isolated, which can be combined to achieve better technical effects.

Example 1

This example provides a visible light detector with high-photoresponse based on $TiO_2/MoS_2$ heterojunction, the detector is based on a back-gated field-effect transistor based on $MoS_2$, and the detector includes a $MoS_2$ channel, a $TiO_2$ modification layer, a $SiO_2$ dielectric layer, Au source/drain electrodes and a Si gate electrode, the $TiO_2$ modification layer is modified on the surface of the $MoS_2$ channel. At a zero-gate voltage and under the illumination of a white-light LED, the detector can reach a high photoresponsivity of 1099 A/W and a high specific detectivity of $1.67 \times 10^{13}$ Jones.

Preferably, the $MoS_2$ channel is few-layer $MoS_2$ flakes with a high crystallinity, the $MoS_2$ flakes are in a hexagonal phase with a single-crystal structure; the few-layer means 3 layers, and the overall thickness is 2-2.5 nm.

Preferably, the $TiO_2$ modification layer is a naturally oxidized $TiO_2$ layer, and the thickness of the $TiO_2$ layer is 1-2 nm.

Preferably, the $TiO_2$ layer is in a crystalline state or an amorphous state, and when the $TiO_2$ layer is in the crystalline state, it has single-crystal sheets.

Example 2

This example provides a method of preparing the visible light detector with high-photoresponse based on $TiO_2/MoS_2$ heterojunction.

Figure 1:
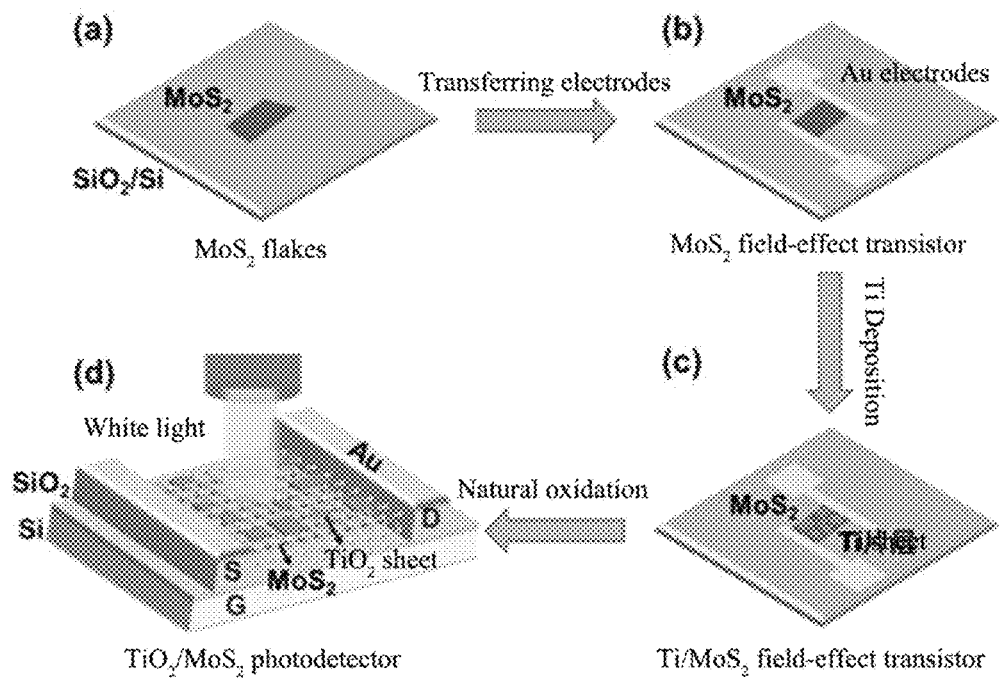
FIG. 1 is a schematic diagram showing the preparation process of a visible light detector with high-photoresponse based on $TiO_2/MoS_2$ heterojunction according to one example of the present disclosure. Where: (a) shows the few-layer $MoS_2$ flake prepared by micromechanical exfoliation; (b) shows the back-gated field-effect transistor based on $MoS_2$ constructed by transferring the electrodes; (c) shows the transistor based on $Ti/MoS_2$ generated by e-beam evaporation of Ti; (d) shows the photodetector based on $TiO_2/MoS_2$ heterojunction after oxidation.

S1. Preparation of few-layer $MoS_2$ flakes with nanometer thickness and high crystallinity;

S1.1 Taking an appropriate amount of bulk $MoS_2$ crystals and placing them on one adhesive side of Scotch tapes;

S1.2 Folding both ends of the adhesive tapes in half along the middle, contacting the other adhesive side of the adhesive tapes with the upper surface of $MoS_2$ bulks, compacting the part of adhesive tapes attached with $MoS_2$ gently, tearing slowly so that the $MoS_2$ bulks can be divided into two parts, repeating multiple times of sticking and tearing, until small pieces of $MoS_2$ were distributed on both sides of the adhesive tapes discretely;

S1.3 Cutting the adhesive tapes in the middle, attaching the side attached with $MoS_2$ slowly onto $SiO_2/Si$ substrates that have been washed with piranha solution, flattening and squeezing the adhesive tapes, heating the $SiO_2/Si$ wafer attached with $MoS_2$ on adhesive tapes on a heating plate at 100° C. for 2 min to enhance the adhesion between $MoS_2$ and the substrates;

S1.4 Tearing the adhesive tapes slowly from the silicon wafer, resulting in that the $MoS_2$ flakes being transferred onto the substrates (FIG. 1(*a*)).

S2. Preparation of field-effect transistor based on $MoS_2$

S2.1 Cutting silicon wafers plated with an array of gold electrodes at a thickness of 50 nm into rectangular chips of 0.5 cm×1 cm by using a silicon knife;

S2.2 Dropwise adding an appropriate amount of PMMA solution onto the surface of chips with electrodes, spin-coating at a low rate of 1000 r/min for 10 s firstly, then spin-coating at a high rate of 4000 r/min for 50 s; placing the chips with electrodes spin-coated with PMMA on a heating plate and heating at 120° C. for 3 min for solidification, scraping PMMA off the edge of silicon wafers with a knife in case of blocking the etching of the oxidation layer;

S2.3 Immersing the electrode chips with solidified PMMA right side up in a HF solution (the volume ratio of HF to $H_2O$ is 1:3), etching at room temperature for 2 h, taking them out with acid and alkali resistant tweezers and rinsing with deionized water for many times; covering a piece of PDMS over the electrodes, and exfoliating the electrodes off the silicon wafers slowly;

S2.4 With the use of a probe station, placing $MoS_2$ flakes in the spot region of the microscope on a translation stage, adjusting the optical microscope while adjusting the X-Y-Z translation stage to stack the electrodes on $MoS_2$ flakes accurately, heating at 140° C. for 3 min to make PDMS to be softened and lose viscosity, exfoliating PDMS off so that the PMMA films attached with electrodes can be transferred onto the $MoS_2$ flakes; then heating the device at 180° C. for 3 min to enhance the adhesion between the electrodes and $MoS_2$;

S2.5 Immersing the device attached with PMMA films in an acetone solution for 2 h to dissolve PMMA, and washing the device with isopropanol and deionized water successively;

S2.6 Placing the device in a tubular furnace, introducing a mixed atmosphere of $Ar/H_2$ at 40 sccm, maintaining the pressure within the furnace at 10 Pa, annealing at 200° C. for 1 h so as to further remove PMMA and enhance the contact between the gold electrodes and $MoS_2$, thus obtaining the field-effect transistor based on $MoS_2$ (FIG. 1(B)).

S3. Deposition of metal Ti

S3.1 Taking an appropriate amount of Ti target material particles into a crucible, and sticking the wafers with $MoS_2$ samples onto a substrate with high-temperature adhesive tapes.

S3.2 Setting the thickness of the deposited Ti film to be 2 nm and the depositing rate to be 0.2 Å/s.

S3.3 When the base pressure reached $1 \times 10^{-4}$ Pa, heating the target materials with e-beam; when the depositing rate on the film thickness gauge was steady, opening the middle baffle, so that Ti can be deposited on the surface of the device channel at room temperature (FIG. 1(*c*)).

S4. Natural oxidation of Ti

A $Ti/MoS_2$ heterojunction device will be oxidized to a $TiO_2/MoS_2$ heterojunction device quickly when exposed in air (FIG. 1(D)), which was then stored in a vacuum vessel at 2000 Pa.

Example 3

1. Characterization of the Visible Light Detector with High-Photoresponse Based on $TiO_2/MoS_2$ Heterojunction The surface morphology of the samples was characterized by using a Bruker Multimode 8 atomic force microscope (AFM). The microstructure of the samples was characterized by using a JEOL 2200FS transmission electron microscope (TEM) equipped with electron energy loss spectroscopy (EELS). X-ray photoelectron spectroscopy (XPS) was harvested by using a PHI 5000 VersaProbe III X-ray photoelectron spectrometer. Raman spectrum (Raman) was harvested by using a Horiba Jobin Yvon HR-800 micro-Raman system excited with 532 nm laser.

2. Photoresponse Test

The photoresponse of the photodetector based on $TiO_2$/$MoS_2$ heterojunction was tested in air by using a B1500A semiconductor parameter analyzer (Agilent). LED visible lights for test mainly include visible lights at three wavelengths of 450 nm, 541 nm and 715 nm. The spot diameter was 3 mm, far greater than the length and width of the channel of the device.

3. Results and Discussion

Figure 2A:
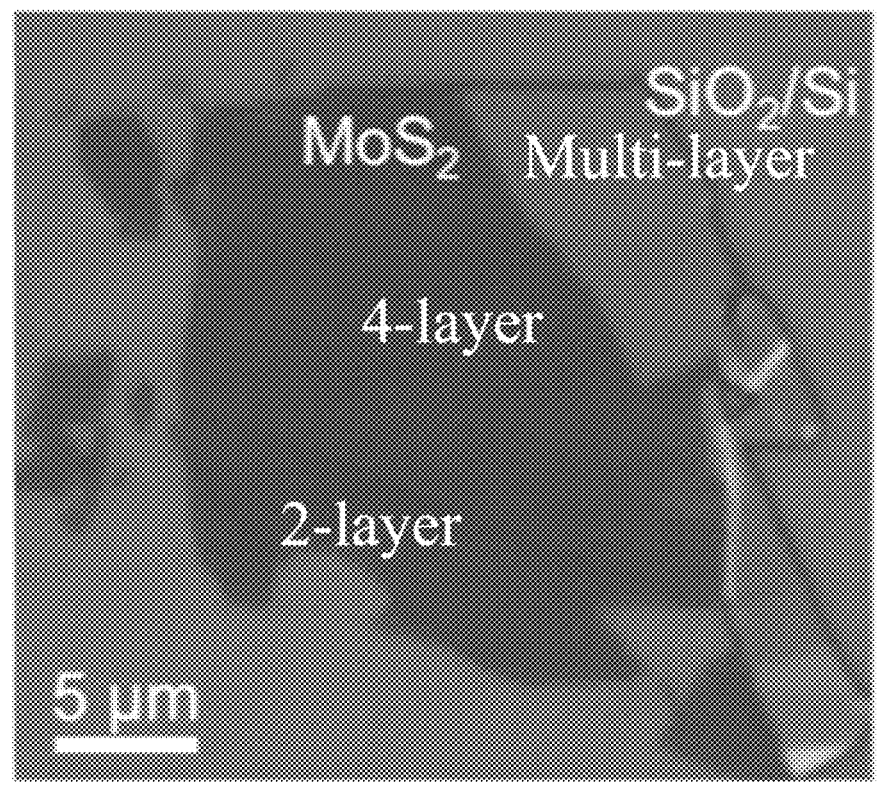
FIG. 2A shows an optical image of the few-layer $MoS_2$ flakes.
Figure 2B:
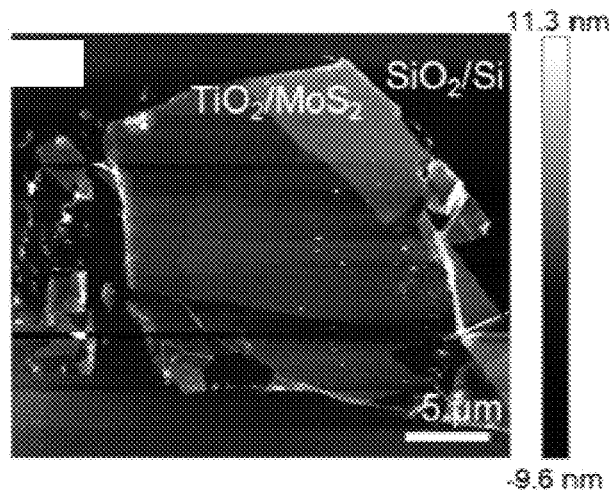
FIG. 2B shows an atomic force microscope image of the $MoS_2$ heterostructure modified with $TiO_2$.

Firstly, few-layer MoS2 flakes were obtained by exfoliation (FIG. 2a), and upon the completion of $TiO_2$ modification, the surface morphology of $TiO_2$/$MoS_2$ heterojunction was characterized by AFM. As shown in FIG. 2B, the surface of $MoS_2$ modified with $TiO_2$ was smooth and clean, the root-mean-square roughness was about 0.3 nm, and there were no significant island particles, indicating the layered growth of Ti on $MoS_2$.

Figure 3A:
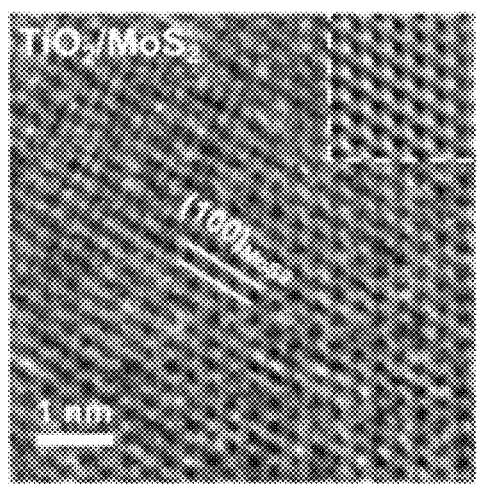
FIG. 3A shows a high-resolution transmission electron microscope image of the $TiO_2/MoS_2$ heterojunction.
Figure 3B:
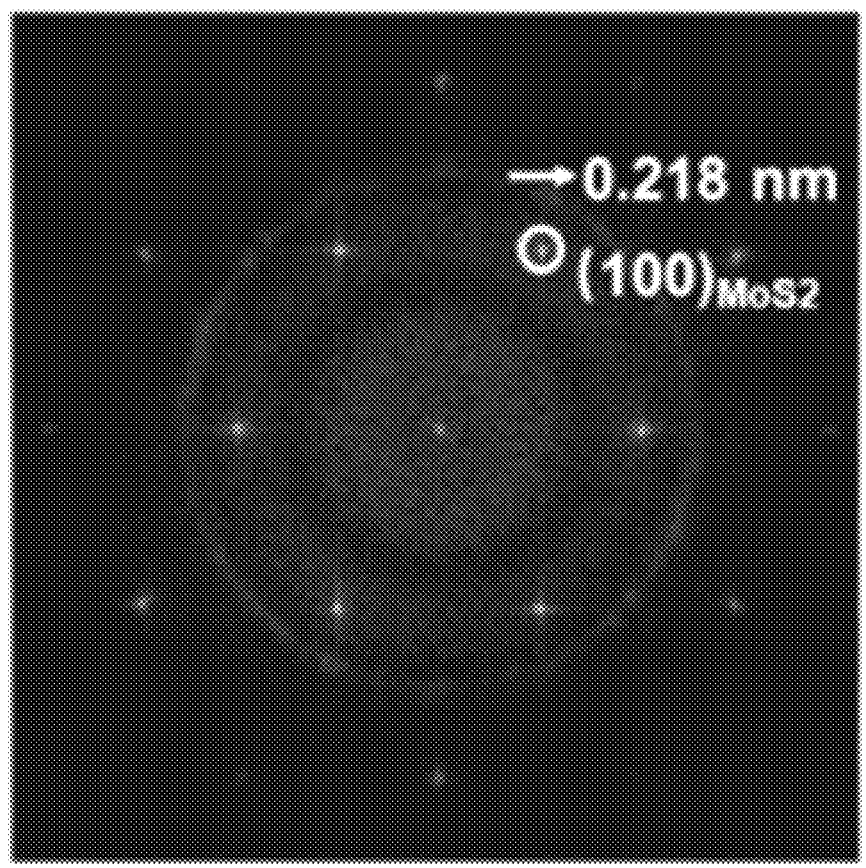
Figure 3C:
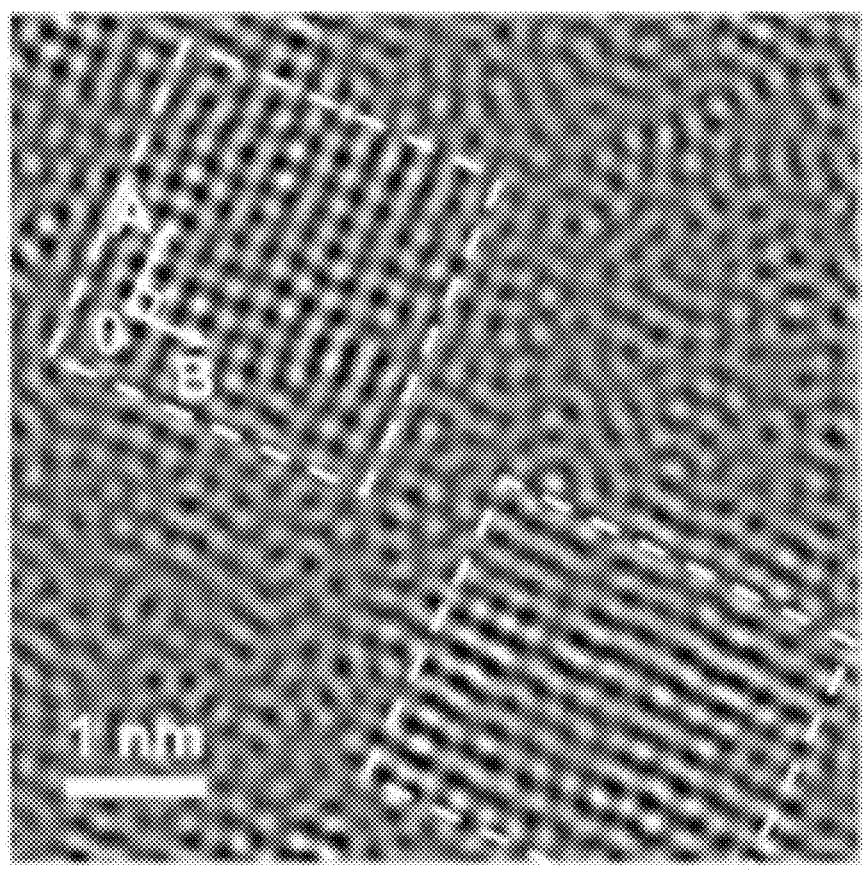
FIG. 3C shows an inverse fast Fourier transform pattern of the diffraction ring from $TiO_2$ in FIG. 3b.
Figure 3D:
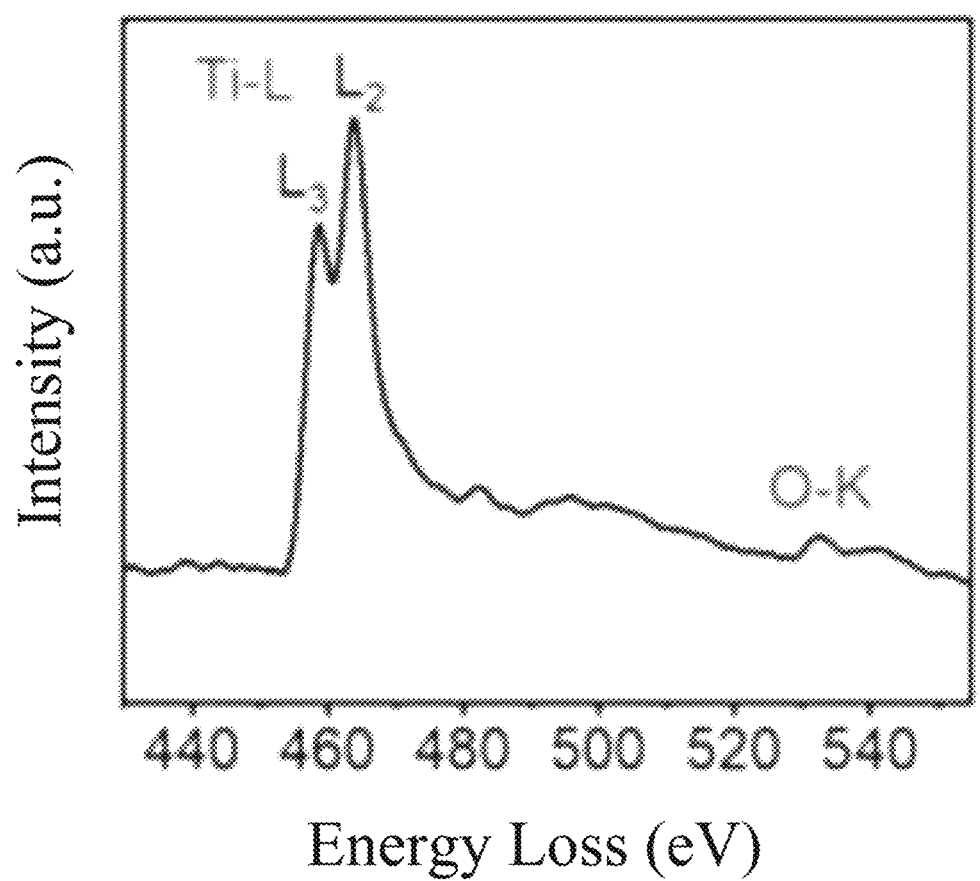
FIG. 3D shows an electron energy loss spectroscopy of the $TiO_2/MoS_2$ heterojunction, showing the signal from Ti.

The high resolution transmission electron microscope (HRTEM) image shows the microstructure of $TiO_2$/$MoS_2$ heterojunction (FIG. 3A), indicating that $MoS_2$ has a good crystallinity. The FFT image containing the region as shown in FIG. 3A is shown in FIG. 3B, showing the hexagonal symmetric diffraction spots of $MoS_2$. In addition, a weak diffraction ring corresponding to a plane with a lattice spacing of 0.218 nm can be observed. FIG. 3C shows an IFFT image of the polycrystalline ring, from which we can observe the two nanosheets (NSs) in the region as shown in FIG. 3A. The sheet on the upper left is roughly a square 2-3 nm on a side, and the spacing of crystal faces in two orthogonal directions is 0.219 nm (OA) and 0.213 nm (OB) respectively. The amorphous layer between the nanosheets may be amorphous $TiO_2$. To further determine the components of the nanosheets, an EELS analysis was conducted. As shown in FIG. 3D, significant $Ti-L_3$, $Ti-L_2$ and O—K peaks can be observed, which are located at 458.8 eV, 463.6 eV and 532.4 eV respectively, demonstrating the formation of $TiO_2$ on the surface of $MoS_2$.

Figure 4:
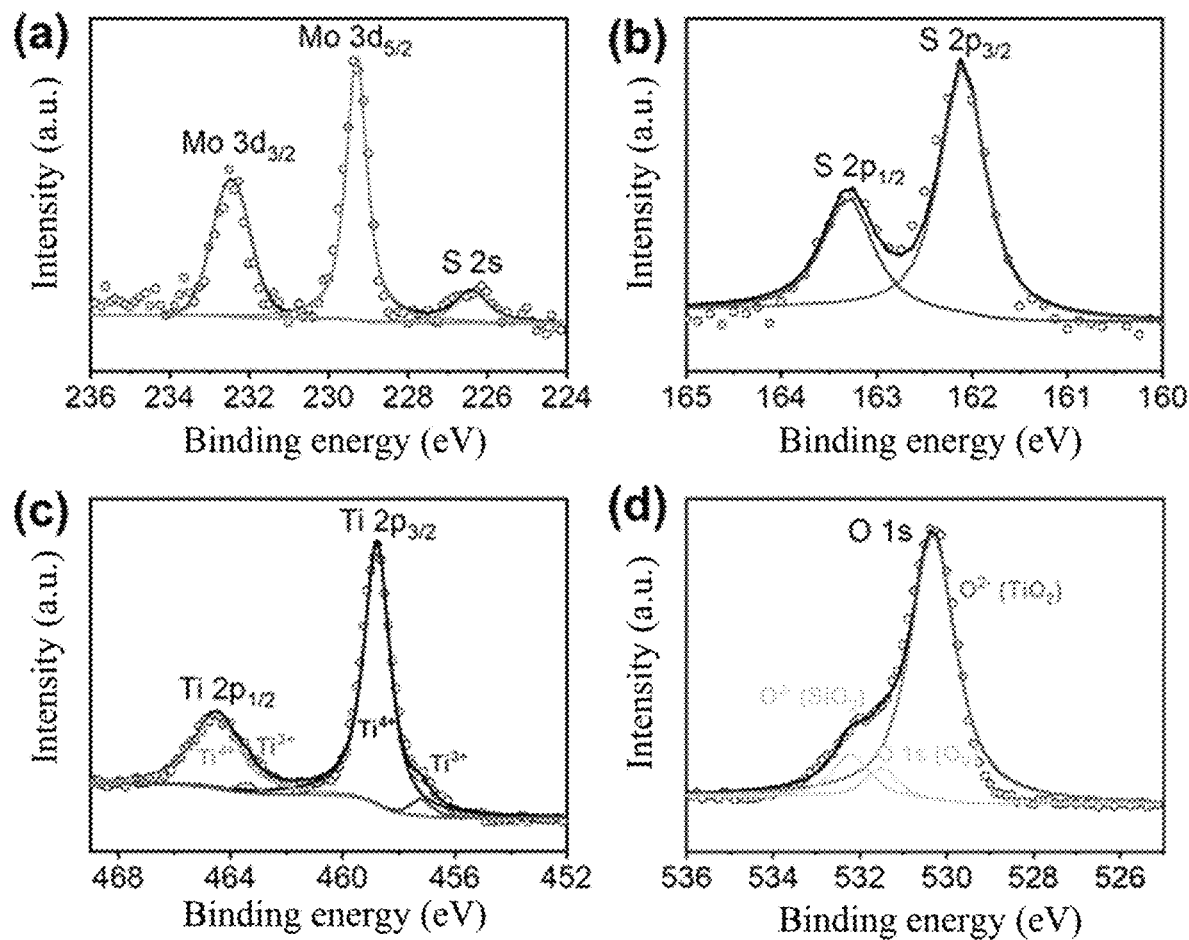
FIG. 4 shows an X-ray photoelectron spectroscopy of the $TiO_2/MoS_2$ heterojunction, where a-d show core-level high resolution XPS spectra of Mo 3d, S 2p, Ti 2p and O1s in $TiO_2/MoS_2$, respectively.

The electronic state and interfacial interaction of $TiO_2$/$MoS_2$ were characterized by using XPS. In FIG. 4, (A) and (B) showed Mo $3d_{5/2}$, Mo $3d_{3/2}$, S $2p_{3/2}$, and S $2p_{1/2}$ doublet peaks, in which the peak positions were consistent with those in XPS spectrum of pristine $MoS_2$. The spectrum of Ti 2p core level was shown in FIG. 4(C), the doublet peaks of Ti $2p_{3/2}$ and Ti $2p_{1/2}$ were detected at 458.78 eV and 464.50 eV, which corresponds to the binding energies of $Ti^{4+}$ in $TiO_2$. The two satellite peaks at 457.20 eV and 463.40 eV may arise from $Ti^{3+}$ caused by the oxygen vacancies in $TiO_2$. This result further confirmed that Ti on $MoS_2$ was oxidized to $TiO_2$, and there was no interfacial reaction between Ti and $MoS_2$. In the spectrum of 0 is core level as shown in FIG. 4(D), the peak at 531.50 eV derives from the oxygen vacancies in $TiO_2$.

Figure 5A:
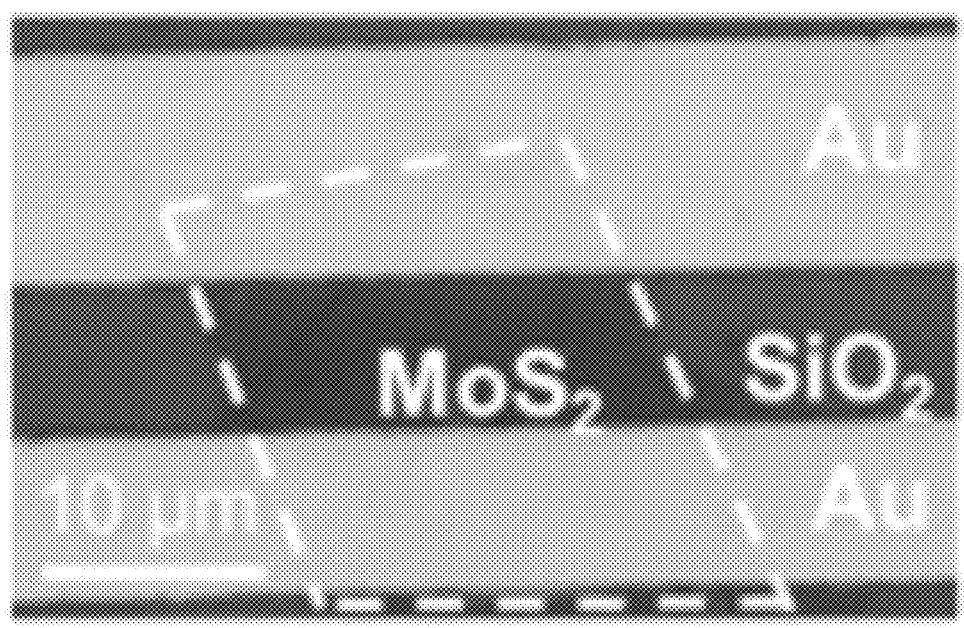
FIG. 5A shows an optical image of the field-effect transistor based on $MoS_2$.
Figure 5B:
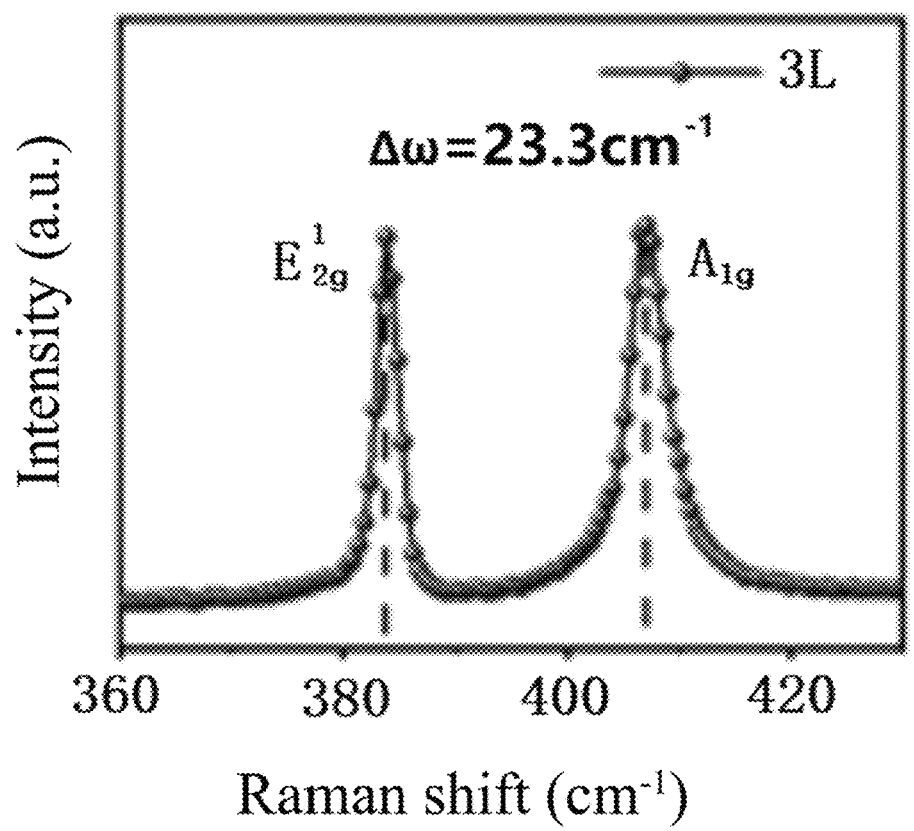
FIG. 5B shows a Raman spectrum of the $MoS_2$ flake.
Figure 5C:
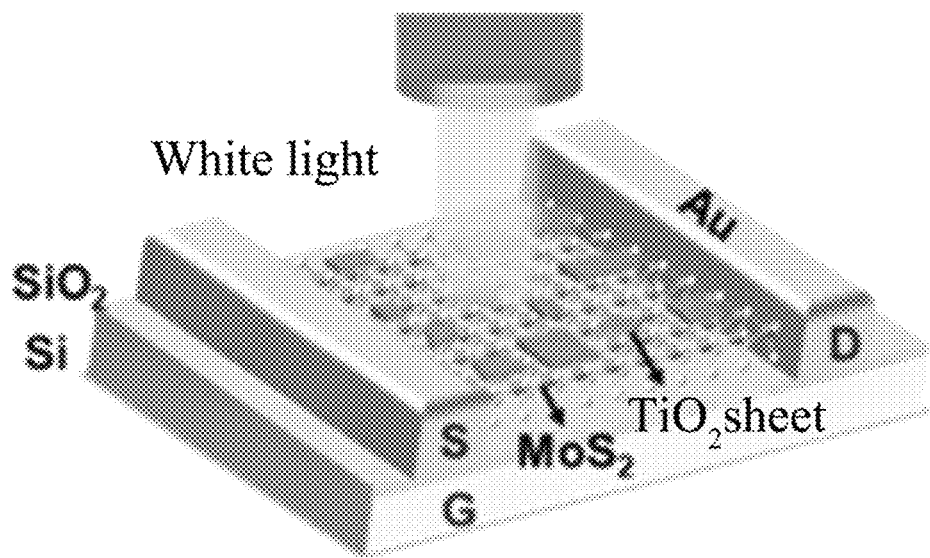
FIG. 5C shows a 3D-model diagram of the photodetector based on $MoS_2$ modified with TiO2 nanosheets.
Figure 5D:
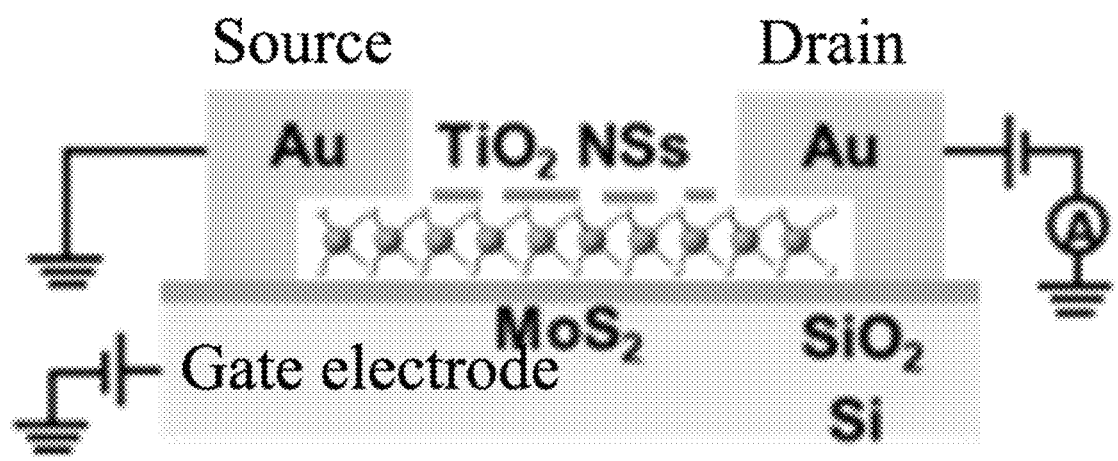
FIG. 5D shows a 3D-model and cross-section diagram of the photodetector based on $MoS_2$ modified with $TiO_2$ nanosheets.

The optical image of the field-effect transistor based on $MoS_2$ is as shown in FIG. 5A, in which the length and width of the channel are 7 μm and 17 μm respectively, and the area of the device is about 119 μm². The frequency difference between the two Raman characteristic peaks $E_{2g}^1$ and $A_{1g}$ is 23.3 cm$^{-1}$ (FIG. 5B), indicating that the $MoS_2$ flake has triple layers. After conducting a photoresponse test on the photodetector based on $MoS_2$, Ti with a thickness of 2 nm was deposited on the channel, which is oxidized naturally to get the photodetector based on $TiO_2$/$MoS_2$ heterojunction, its 3D-model and cross-section diagram were shown in FIG. 5C and FIG. 5D.

Figure 6A:
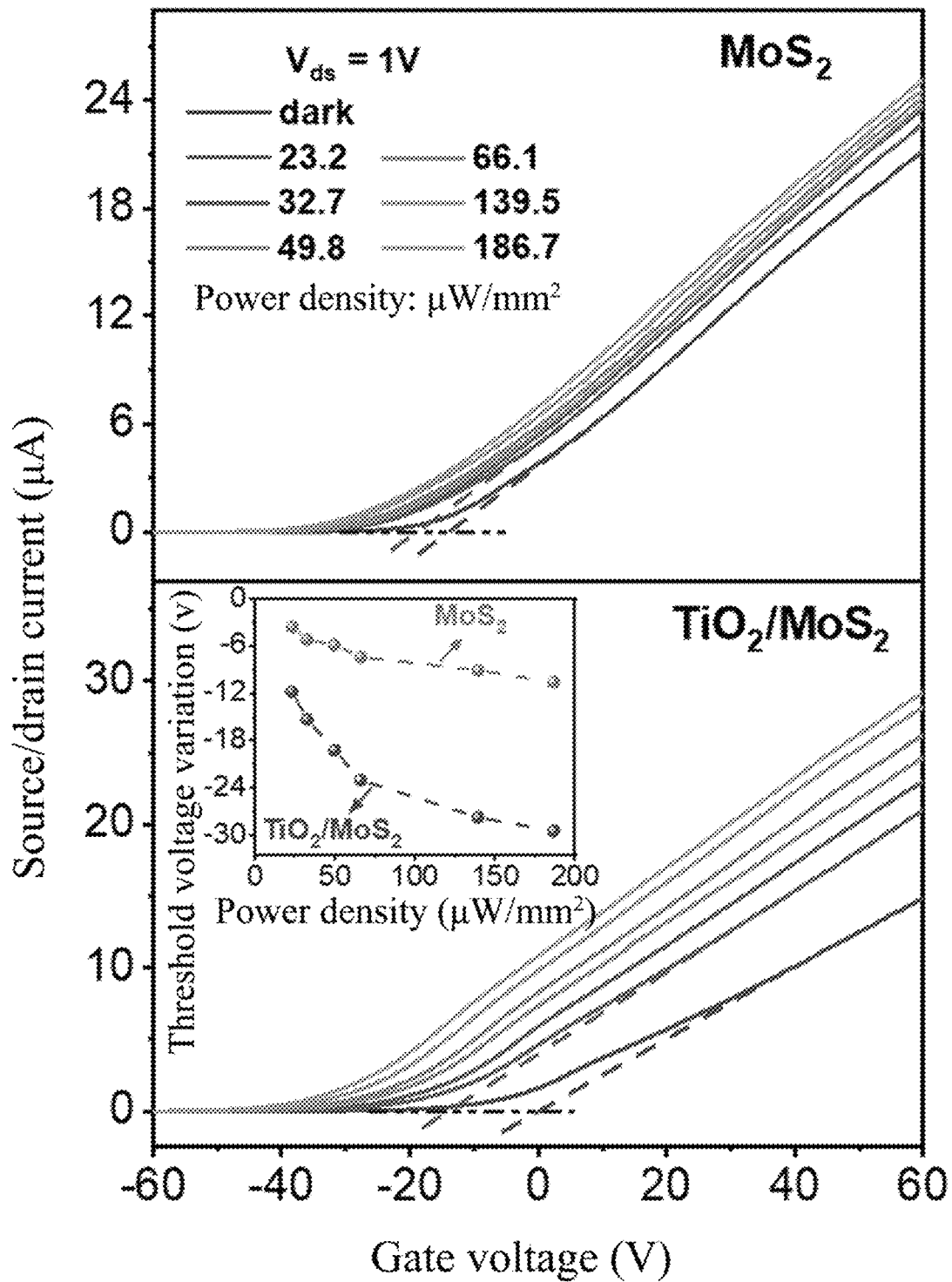
FIG. 6A shows transfer curves of photodetectors based on $MoS_2$ and $TiO_2/MoS_2$ respectively in dark and under different illumination power densities at a source/drain bias of 1 V, with the inset showing the dependence of threshold voltage variations on the power density.
Figure 6B:
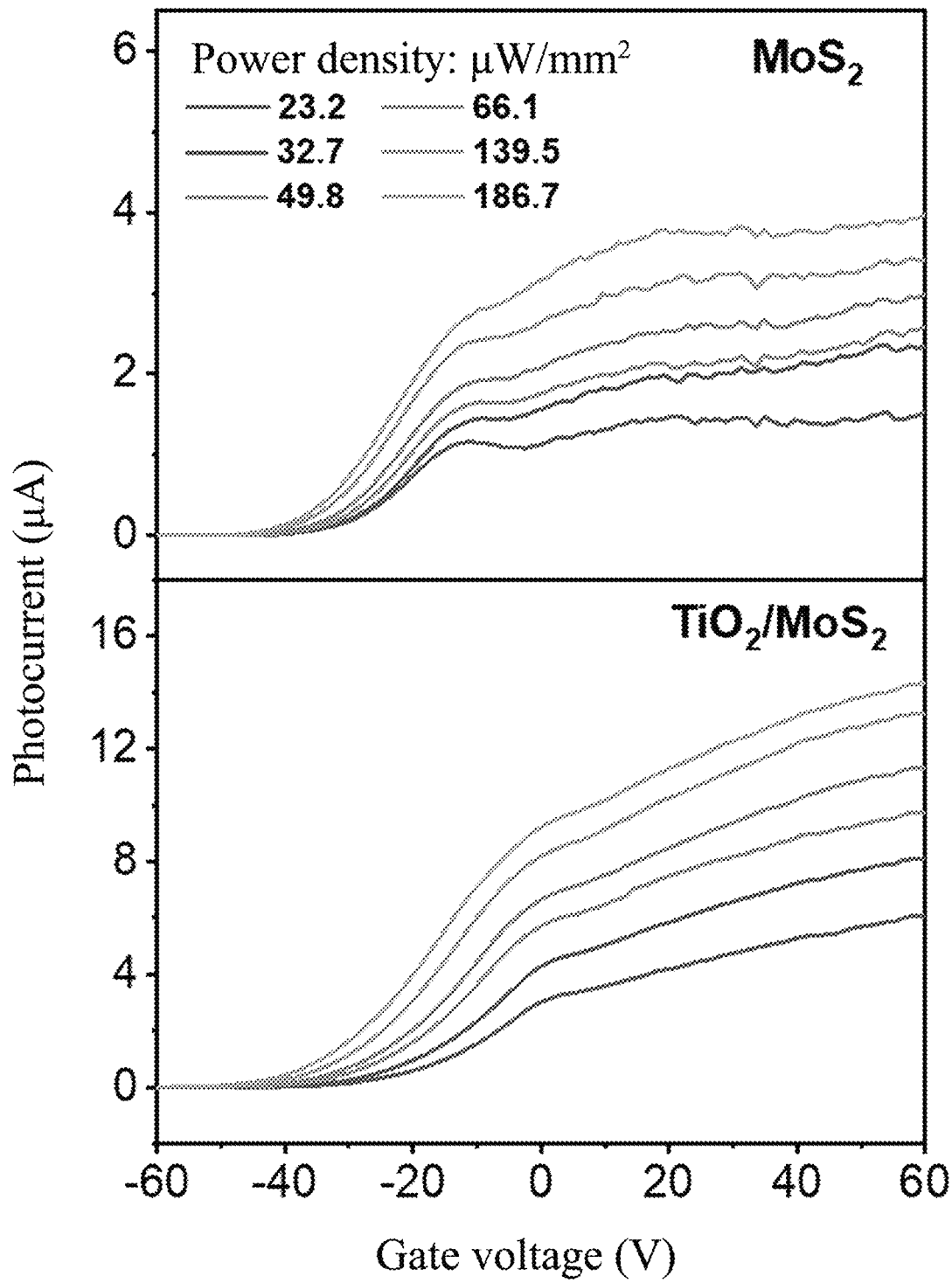
FIG. 6B shows the photocurrents as a function of the gate voltages under different power densities.

FIG. 6A shows transfer curves of two photodetectors in dark and under different illumination power densities. With the increase of the power density of white-light, the transfer curve of the photodetector based on $MoS_2$ moves towards the negative direction gradually, and the threshold voltage changes, indicating that the photogating effect dominates the photoresponse. Compared with the pure $MoS_2$ device, the threshold voltage variation of the detector based on $TiO_2$/$MoS_2$ is more significant, as shown in the inset of FIG. 6A. It indicates that $TiO_2$ enhances the photogating effect of $MoS_2$, of which the enhancement mechanism will be discussed later. FIG. 6B shows the photocurrents as a function of the gate voltages for the two photodetectors. At the same power density, the photocurrent of the detector based on $TiO_2$/$MoS_2$ is significantly greater than that of the device based on $MoS_2$. Compared with the photodetector based on pure $MoS_2$, the photocurrent of the device based on $TiO_2$/$MoS_2$ increases continually with the increase of the gate voltage, this is due to that under light illumination, electrons in $TiO_2$ are injected into $MoS_2$, increasing the electron concentration in $MoS_2$, thereby increasing the channel current. The interface charge transfer behavior will be discussed in the photoresponse mechanism later.

Figure 6C:
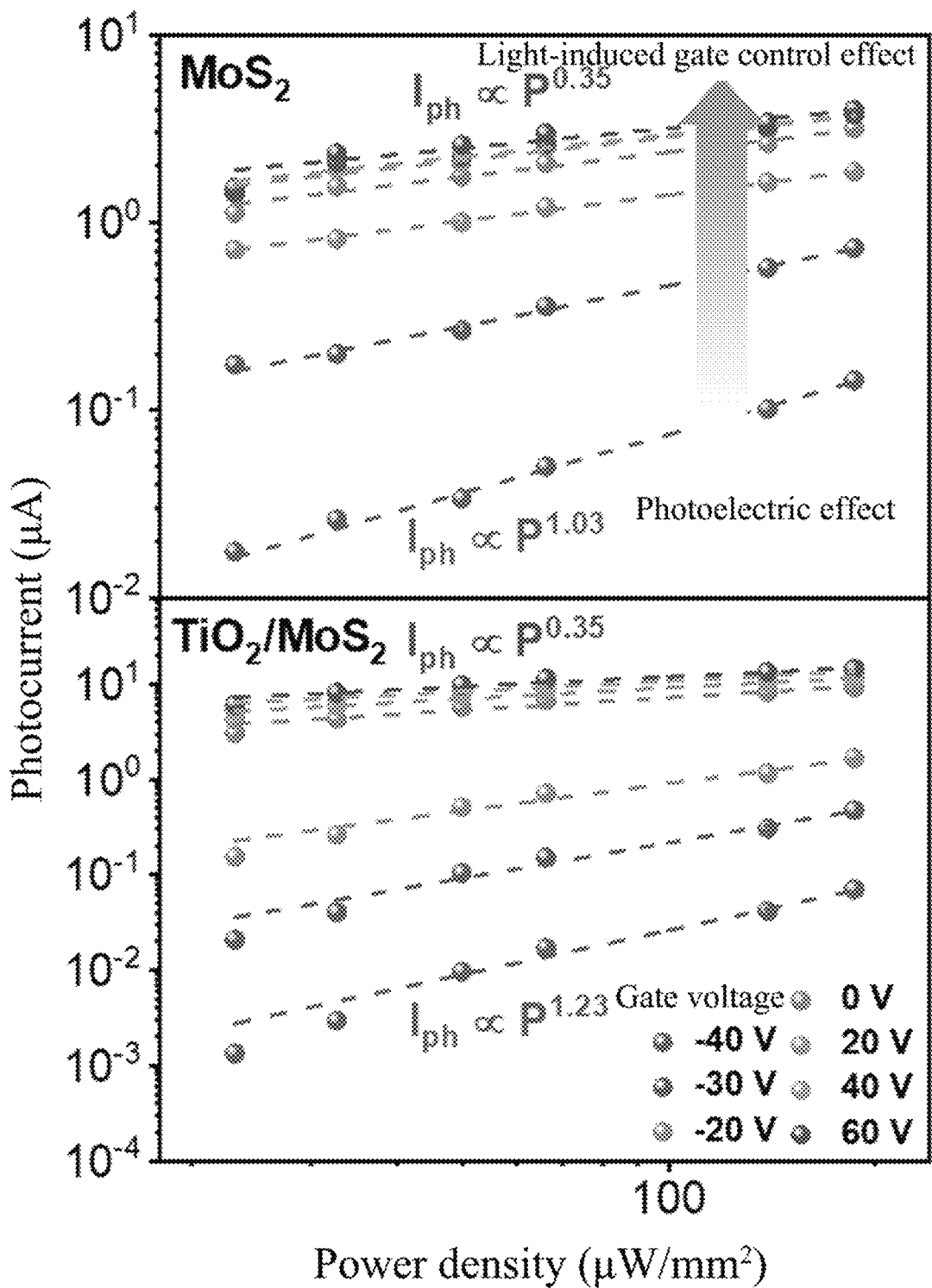
FIG. 6C shows the dependence of the photocurrents on the power density at different gate voltages.

FIG. 6C describes the dependence of the photocurrents on the power density at different gate voltages, in which the dependence of the photocurrents on the power density is fitted by using an index-law equation. For the photodetector based on pure $MoS_2$, under a reverse bias of −40 V, the photocurrent increases almost linearly with the increase of the power density (a≈1.03), indicating that the photo-generated carriers are mainly determined by the flux of incident photon, and the photoconductive effect plays a key role in the generation of photocurrent. However, under a forward bias of 60 V, it is observed that there is a strong sublinear relationship between the photocurrent and the power density (α=0.35), indicating that the photogating effect dominates the generation of photocurrent. Under light illumination, photo-generated holes were then captured by traps and generate a local electric field, thereby causing the transfer curve to shift towards the negative direction. A similar dependence of the photocurrent on the power density was also found in the photodetector based on $TiO_2$/$MoS_2$.

Figure 7A:
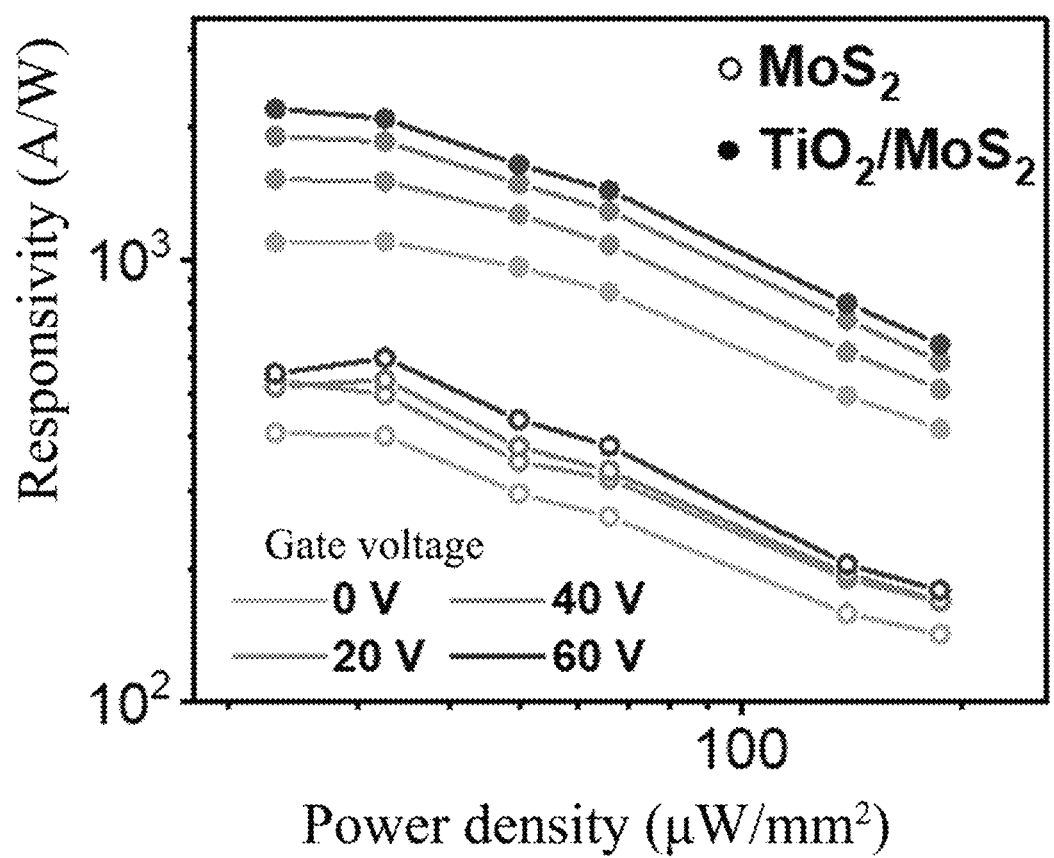
FIG. 7A shows the dependence of the responsivities of photodetectors based on $MoS_2$ and $TiO_2/MoS_2$ respectively on the power density at different gate voltages.

FIG. 7A describes the dependence of the responsivities of photodetectors based on $MoS_2$ and $TiO_2$/$MoS_2$ respectively on the power density at different gate voltages. The responsivity of the photodetector based on $TiO_2$/$MoS_2$ is significantly higher than that of the device based on $MoS_2$. The responsivity decreases almost monotonically with the increase of the power density, this is because the trapped charges in $MoS_2$ have become saturated, thus confirming the dominant mechanism of photogating effects. FIG. 7C compares the responsivities of the two photodetectors at different gate voltages. At zero bias voltage, at a power density of 23.2 μW/mm², the responsivity of the photodetector based on $TiO_2$/$MoS_2$ reaches up to 1099 A/W, which is about 1.7 times that of a detector based on pure $MoS_2$ (406 A/W). The responsivity can be further enhanced by applying a higher bias voltage.

Figure 7B:
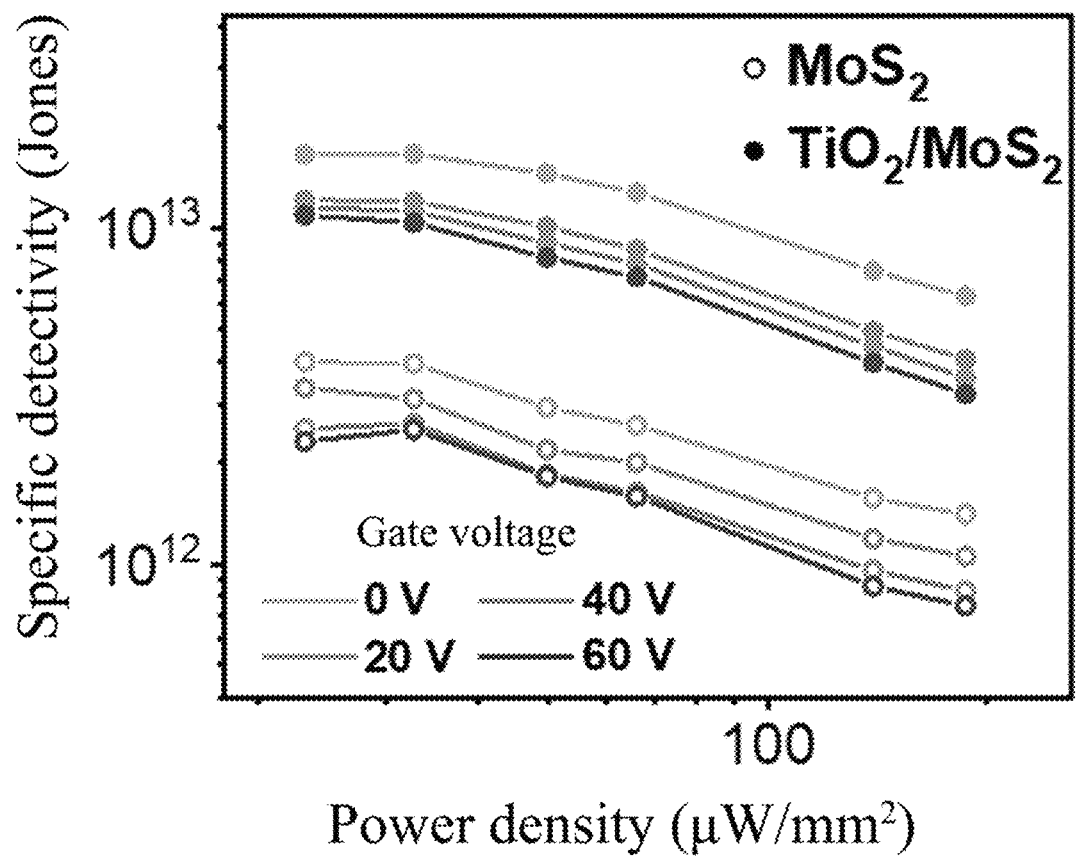
FIG. 7B shows the dependence of the specific detectivities of photodetectors based on $MoS_2$ and $TiO_2/MoS_2$ respectively on the power density at different gate voltages.
Figure 7C:
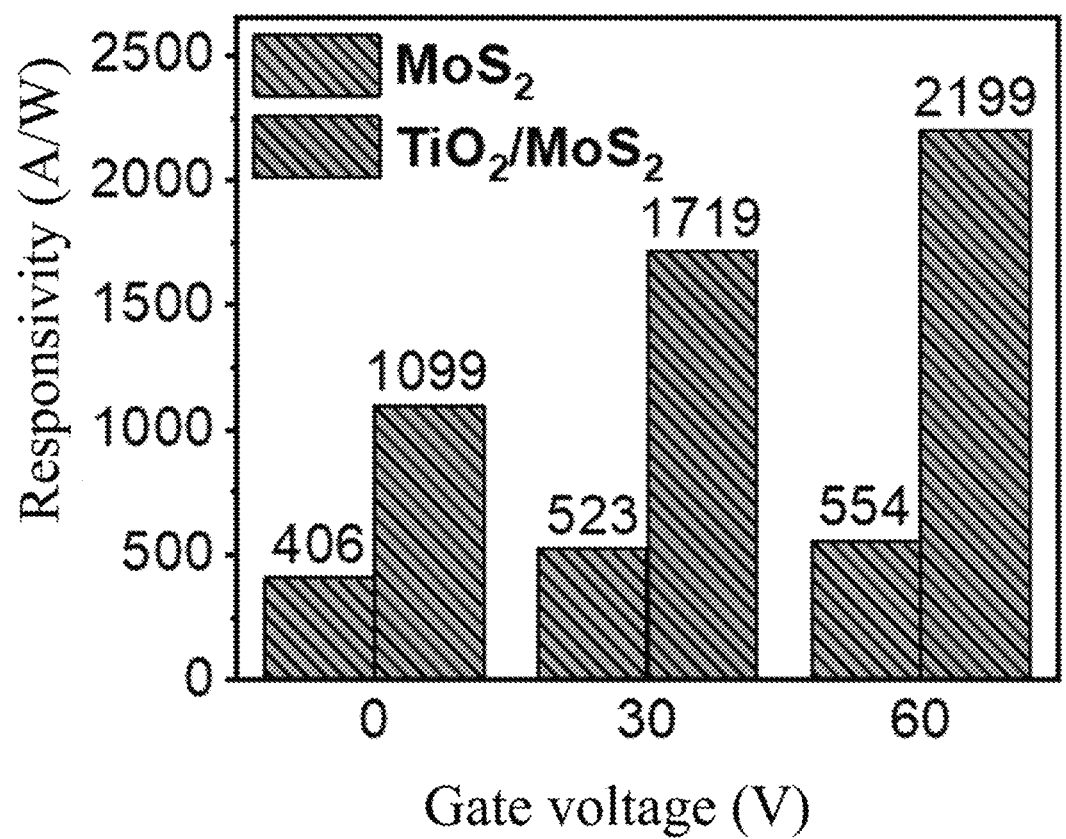
FIG. 7C shows the responsivity comparison of the two photodetectors based on $MoS_2$ and $TiO_2/MoS_2$ respectively at different gate voltages.
Figure 7D:
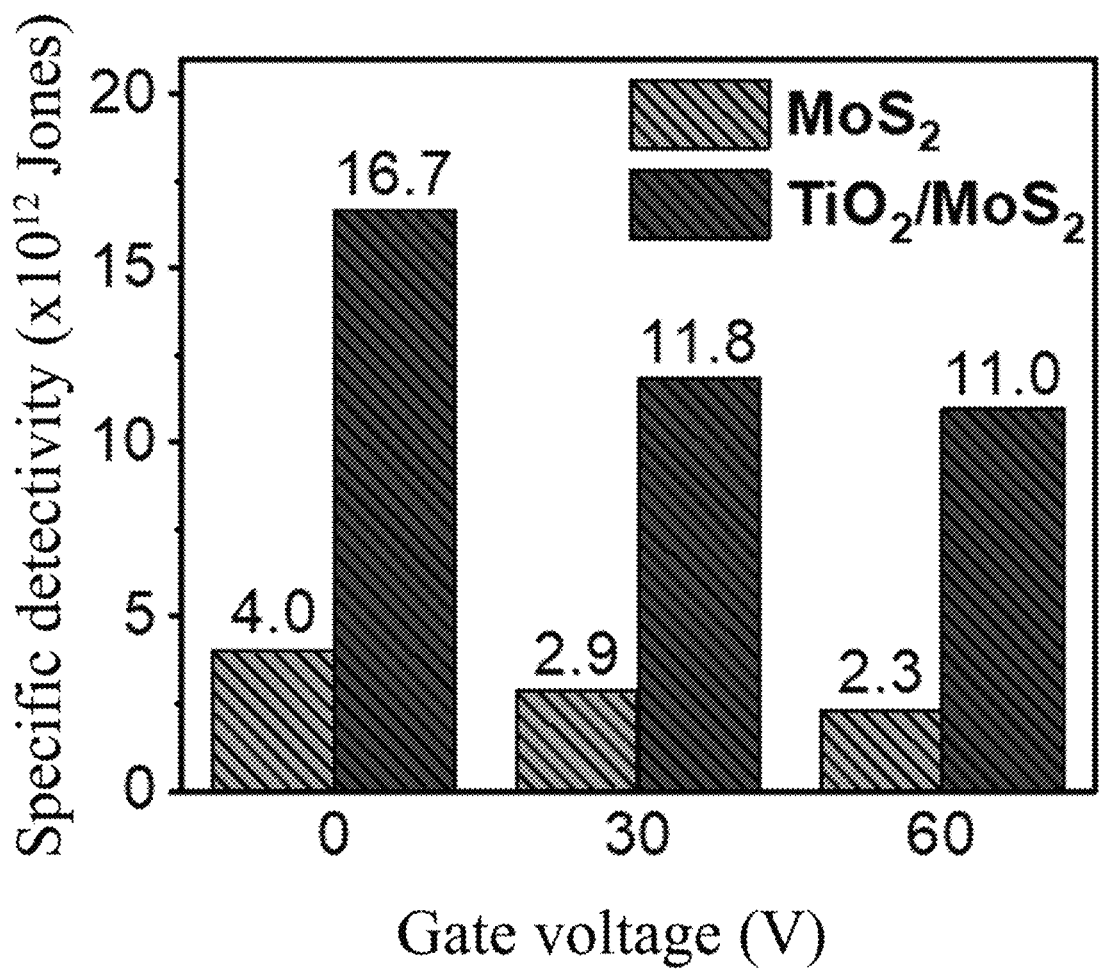
FIG. 7D shows the specific detectivity comparison of the two photodetectors based on $MoS_2$ and $TiO_2/MoS_2$ respectively at different gate voltages.

FIG. 7B describes the dependence of the specific detectivities of the two detectors on the power density at different gate voltages. At gate voltages from 0 V to 60 V, the specific detectivities of the photodetector based on $TiO_2$/$MoS_2$ are all significantly higher than those of the device based on $MoS_2$. At zero-gate voltage, the maximum detectivity of the photodetector based on $TiO_2$/$MoS_2$ is $1.7 \times 10^{13}$ Jones, which is about 3.2 times that of the device based on $MoS_2$ ($4.0 \times 10^{12}$ Jones), as shown in FIG. 7D. In addition, as the gate voltage increasing from 0 V to 60 V, the detectivities of the two photodetectors are all reduced significantly, this is because that at greater gate voltages, the dark current is higher, thus reducing the specific detectivity.

Figure 8A:
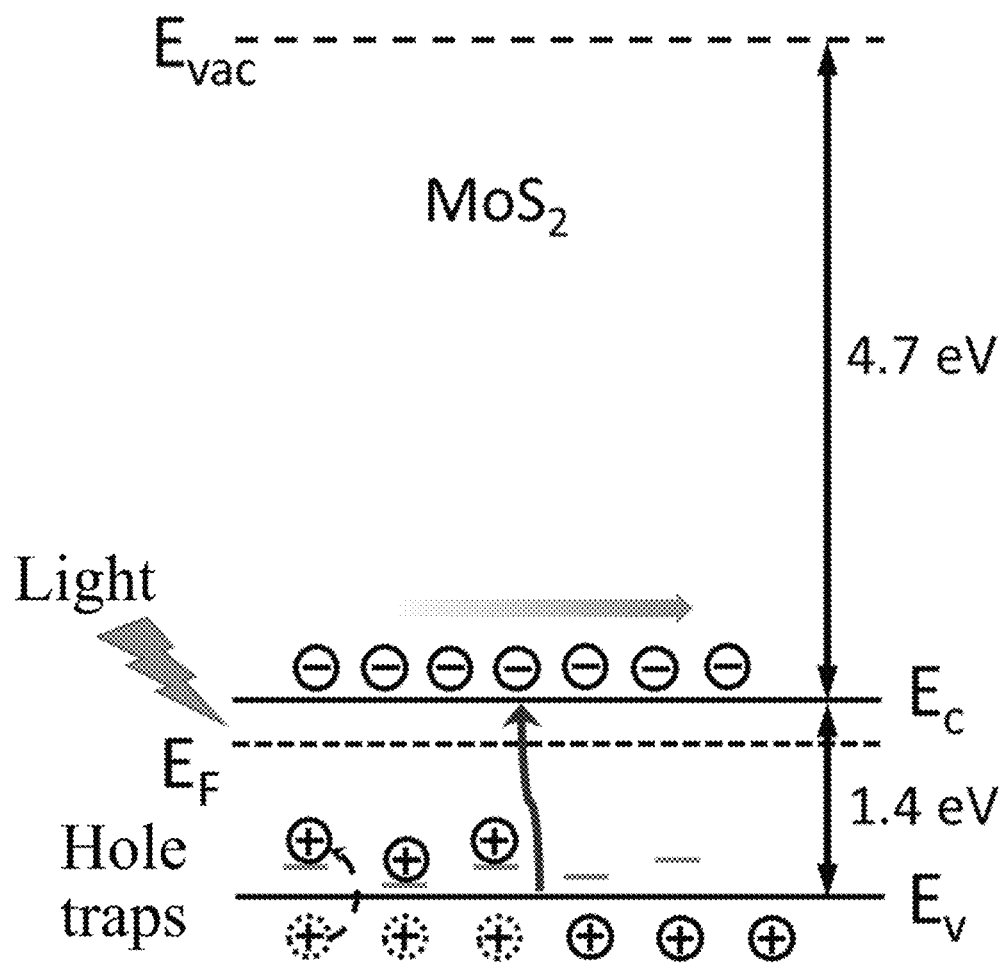
FIG. 8A shows an energy band diagram of a triple-layer $MoS_2$ under visible light illumination.
Figure 8B:
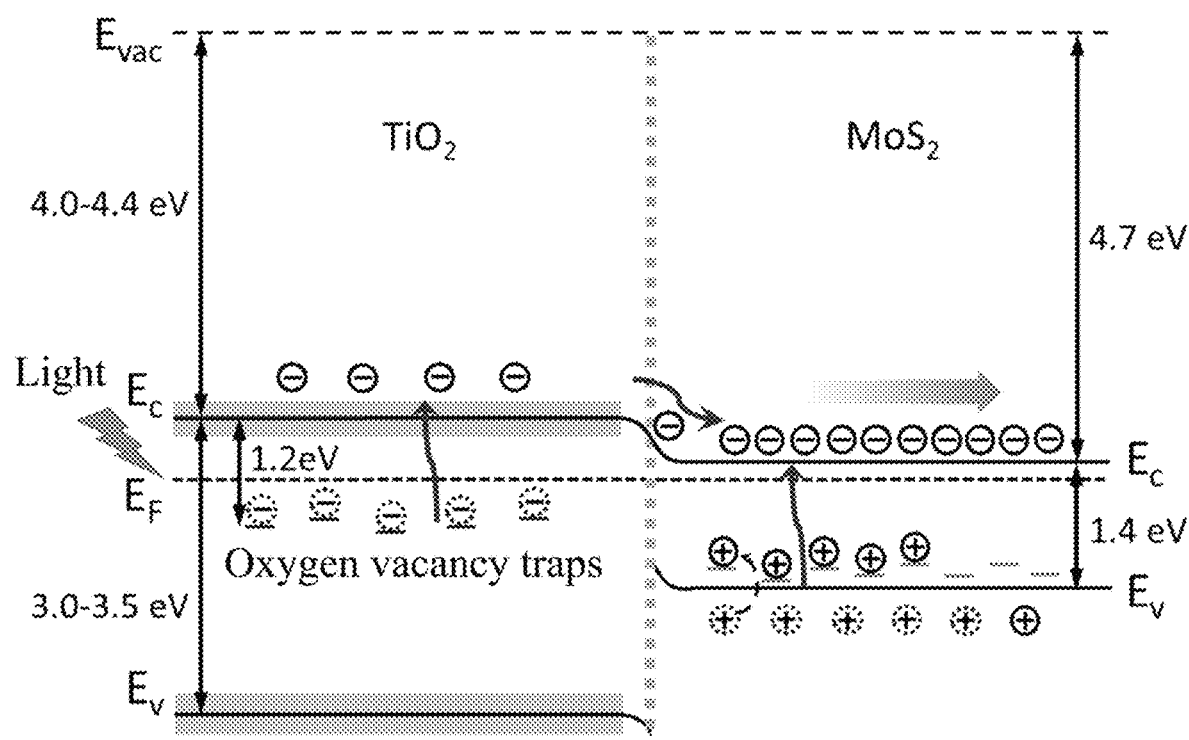
FIG. 8B shows an energy band diagram of the $TiO_2/MoS_2$ heterojunction under visible light illumination.

As shown in FIG. 8A-FIG. 8B, an energy band alignment model of triple-layer $MoS_2$ and $TiO_2$ is employed to illustrate the mechanism of photoresponse. There are hole-traps at the edge of $MoS_2$ valence bands, which may be charge traps introduced by structural defects of $MoS_2$ such as vacancies or dislocations as well as $MoS_2/SiO_2$ interfaces. As shown in FIG. 8A, for the photodetector based on $MoS_2$, under visible light illumination, $MoS_2$ absorbs photon energy and excites electron-hole pairs. The photo-generated holes are then captured by traps, which prolong the life of photo-generated electrons in the conduction band, generate a local gate voltage of a certain magnitude (corresponding to the negative shift of the threshold voltage), and induce more electrons in the channel, thereby enhancing the photoresponse. The defect levels caused by the oxygen vacancies in $TiO_2$ are located at 1.2 eV below the bottom of the conduction band, which can act as electron traps. As shown in FIG. 8B, $TiO_2$ and $MoS_2$ form type I energy band alignment, which helps the transport of electrons from $TiO_2$ to $MoS_2$. The high photoresponse of the photodetector based on $TiO_2/MoS_2$ can be explained in two ways. On the one hand, visible light can excite electrons captured in trap states of $TiO_2$ to make them transit to the conduction band, and then transfer into the $MoS_2$ conduction band, so that the Fermi level of $MoS_2$ can increase slightly, thereby increasing the electron concentration in the $MoS_2$, further increasing the current in the channel, and improving the modulation of the gate voltage on the photocurrent. On the other hand, $TiO_2/MoS_2$ interfaces will introduce a great amount of hole traps into $MoS_2$, thus increasing the density of trap states, which may generate a higher local gate voltage under light illumination, thereby attracting more electrons into the conduction band and improving the optical gain.

In conclusion, the present disclosure employs a micromechanical exfoliation method of tearing and sticking with adhesive tapes (but not limited to this method) and a van der Waals integration method by site-specific transferring of electrodes to construct a back-gated field-effect transistor based on $MoS_2$, then an e-beam evaporation technology is used to deposit the metal Ti at a thickness of 2 nm on the surface of the $MoS_2$ channel, and then a photodetector based on $TiO_2/MoS_2$ heterojunction can be obtained after natural oxidation. Through the method of the present disclosure, a relatively perfect $Au/MoS_2$ interface can be obtained, and this method can avoid the damage to the $MoS_2$ lattice or the introduction of chemical impurities; at the same time, the strong wettability of Ti increases the contact area between $TiO_2$ and $MoS_2$, and the oxygen vacancies generated from the incomplete oxidation of Ti improve the responses of $TiO_2$ to the visible light. Under visible light illumination, the photodetector based on $TiO_2/MoS_2$ exhibits a high photoresponsivity of 1099 A/W and a high specific detectivity of $1.67 \times 10^{13}$ Jones, which are increased by 1.7 times and 3.2 times respectively compared to those of the device based on $MoS_2$.

The present disclosure proposes a simple method for preparing the visible light detector with high-photoresponse based on $TiO_2/MoS_2$ heterojunction, which can be extended in commercial applications at a low cost and in a high efficiency. However, it should be noted that, the production rate of $MoS_2$ in the micromechanical exfoliation process is too low, so it is difficult to prepare in large scale. Therefore, in industrial applications, chemical vapor deposition or physical vapor deposition can be used to prepare $MoS_2$ thin films with large area. This study not only provides a good foundation for the application of transition metal dichalcogenides in photoelectric detection, but also provides a new idea for the development of novel high performance photodetectors.

Although several examples of the present disclosure have been given herein, it should be understood by the technical persons in the art that variations can be made to the examples herein without deviating from the spirit of the present disclosure. The above examples are only exemplary, rather than being considered as the limitation on the protection scope of the present disclosure.

What is claimed is:

1. A visible light detector with photoresponse based on a $TiO_2/MoS_2$ heterojunction, comprising a $MoS_2$ channel, a $TiO_2$ modification layer, a $SiO_2$ dielectric layer, Au source/drain electrodes and a Si gate electrode, the $TiO_2$ modification layer being modified on the surface of the $MoS_2$ channel, the $TiO_2$ modification layer being obtained from e-beam evaporation of a certain thickness of metallic Ti film on the surface of the $MoS_2$ channel and natural oxidation of the metallic Ti film, and the $MoS_2$ channel being a few layers of $MoS_2$ flakes with a crystallinity.

2. The visible light detector with photoresponse based on the $TiO_2/MoS_2$ heterojunction according to claim 1, wherein the $MoS_2$ flakes are in a hexagonal phase with a single-crystal structure, the few layers of the $MoS_2$ flakes numbering 3-5 layers, and an overall thickness is 2-2.5 nm.

3. The visible light detector with photoresponse based on the $TiO_2/MoS_2$ heterojunction according to claim 1, wherein the $TiO_2$ modification layer is a naturally oxidized $TiO_2$ layer having a thickness of 1-2 nm.

4. The visible light detector with photoresponse based on the $TiO_2/MoS_2$ heterojunction according to claim 3, wherein the $TiO_2$ modification layer is in a crystalline state or an amorphous state, and when the $TiO_2$ modification layer is in the crystalline state, it has single-crystal sheets.

5. The visible light detector with photoresponse based on the $TiO_2/MoS_2$ heterojunction according to claim 1, wherein at a zero-gate voltage and under illumination of a white-light LED, the detector can reach a photoresponsivity of 1099 A/W and a specific detectivity of $1.67 \times 10^{13}$ Jones.

* * * * *